(12) United States Patent
Watanabe

(10) Patent No.: US 6,731,337 B2
(45) Date of Patent: May 4, 2004

(54) SOLID-STATE IMAGING DEVICE

(75) Inventor: Takanori Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/191,509

(22) Filed: Jul. 10, 2002

(65) Prior Publication Data

US 2003/0016296 A1 Jan. 23, 2003

(30) Foreign Application Priority Data

Jul. 17, 2001 (JP) ........................................ 2001-217117

(51) Int. Cl.[7] ................................................ H04N 3/14
(52) U.S. Cl. ........................ 348/308; 257/292; 257/233
(58) Field of Search ................................ 348/311, 294, 348/302, 303, 308, 309, 310, 313; 257/226, 233, 292, 232, 231

(56) References Cited

U.S. PATENT DOCUMENTS 6,521,925 B1 * 2/2003 Mori et al. .................. 257/292
6,566,678 B1 * 5/2003 Maeda et al. ................. 257/22
6,606,124 B1 * 8/2003 Hatano et al. ............... 348/311
2002/0109160 A1 * 8/2002 Mabuchi et al. ............ 257/233

* cited by examiner

Primary Examiner—Ngoc-Yen Vu
Assistant Examiner—Heather Long
(74) Attorney, Agent, or Firm—Fitzpatrick, Cella, Harper & Scinto

(57) ABSTRACT

A solid-state imaging device includes a photodiode including a well region of a first conductivity type, a first impurity region of a second conductivity type, and a heavily doped impurity region of a first conductivity type formed on the first impurity region. The solid-state imaging device further includes a gate electrode that transfers charges accumulated in the photodiode and a readout region composed of an impurity region of a second conductivity type. A second impurity region of a second conductivity type extends from the first impurity region of a second conductivity type to the readout region. Furthermore, an impurity region of a first conductivity type is formed below the gate electrode. This configuration facilitates complete charge transfer from the photodiode in a readout process. This solid-state imaging device barely generates random noise and can pick up moving images with high definition.

10 Claims, 5 Drawing Sheets

SOLID-STATE IMAGING DEVICE

BACKGROUND OF THE INVENTION

1. Field of the Invention

The present invention relates to solid-state imaging devices. In particular, the present invention relates to a solid-state imaging device that generates minimal random noise and can pick up moving images with high definition.

2. Description of the Related Art

With development in information technology (IT), the demand for area sensors has been rapidly increasing in various applications. In particular, CMOS sensors, which need less electricity to work as compared with CCD sensors, attract attention in applications such as digital cameras and portable terminals. Furthermore, with the increasing demand for higher image quality, noise reduction in area sensors is needed.

The mechanism that causes generation of random noise in a known CMOS sensor will be described with reference to FIG. 5. The CMOS sensor is formed on an n-type semiconductor substrate 401 and includes a p well layer (PWL) 402, a LOCOS oxide film 403, and a gate oxide film 404. The CMOS sensor further includes a photodiode composed of a p+ region 405 and an n region 406. The n region 406 is preliminarily depleted. Light incident on the n region 406 generates charges that are accumulated therein. In a readout process, a positive potential is applied to a gate electrode 407 to switch on the transfer transistor so that the charges are transfer to a readout region 408 formed of a high n region. The threshold of the transfer transistor is controlled by an n region 409.

A CMOS sensor having a structure such as that shown in FIG. 5 has the following problems. Upon occurrence of the charge transfer in the CMOS sensor, a channel is generated in the gate electrode 407 at a superficial position near the gate oxide film 404. In the photodiode, the p+ region 405 suppresses the effect of the surface defect and the n region 406 lies at a deep position a long way from the gate oxide film 404. Upon occurrence of the charge transfer, a potential barrier, which is formed at a connection 410 between the deep position and the superficial position, inhibits the charge transfer. Thus, the charges partially remain in the photodiode. When the number of charges remaining in the photodiode is n, the read data includes a variation of, which is a random noise of the sensor.

In a method designed to prevent the random noise of the sensor, the n region 406 is made to extend under the gate electrode 407 so that the n region 406 and an n− region 409 overlap with each other. In this case, however, the connection 410 has a low-potential region at the overlap position. When the gate electrode is switched off after the charge transfer, the charges formed in the channel remain in the low-potential region and behind the n region 406, also causing the generation of random noise.

SUMMARY OF THE INVENTION

It is an object of the present invention to provide a solid-state imaging device having a structure capable of complete charge transfer to prevent charges from remaining in the photodiode after the readout process. The solid-state imaging device generates minimal random noise, can be used for high-speed readout, and can pick up moving images with high definition.

It is another object of the present invention to provide a method for driving the solid-state imaging device.

According to the present invention, a solid-state imaging device includes a photodiode including a well region of a first conductivity type, a first impurity region of a second conductivity type, and a heavily doped impurity region of a first conductivity type formed on the first impurity region; a gate electrode that transfers charges accumulated in the photodiode; a readout region comprising an impurity region of a second conductivity type; a second impurity region of a second conductivity type extending from the first impurity region to the readout region; and an impurity region of a first conductivity type formed below the gate electrode.

When a transfer transistor in the solid-state imaging device is switched on in this configuration, the charges flow in a region below gate electrode, i.e. the impurity region of a first conductivity type. Thus, no potential barrier is generated at a connection to the first impurity region of a second conductivity type, resulting in complete transfer of the charges accumulated in the first impurity region of a second conductivity type. As a result, no residual charge is present after a readout operation, reducing random noise of the solid-state imaging device.

In the solid-state imaging device, the second impurity region preferably has an impurity concentration such that the second impurity region is completely depleted when charges are accumulated. Preferably, the second impurity region is completely depleted below the gate electrode.

Since no carrier is present when the second impurity region of a second conductivity type is completely depleted, no current flows over the first impurity region of a second conductivity type and the readout region. Thus, charges can be effectively accumulated.

In the solid-state imaging device, a potential that is lower than that applied to the well region is preferably applied to the gate electrode when charges are accumulated.

In this configuration, the electric field effect of the gate electrode facilitates the expansion of the depletion layer in the second impurity region and increases the potential of the second impurity region below the gate electrode, resulting in accumulation of larger amounts of charges in the photodiode.

In the solid-state imaging device, the depth of the second impurity region may be smaller than the depth of the first impurity region.

In the solid-state imaging device, preferably a part of the first impurity region overlaps with the second impurity region at a position in which the first impurity region is in contact with the gate electrode, and another part of the first impurity region does not overlap with the second impurity region.

In this configuration, charges generated in a high depth position in the photodiode are accumulated in a lower-potential position near the surface. This effect enhances the possibility of capturing the charges generated in a large depth side in the photodiode, enhancing the sensor sensitivity. Furthermore, the charges are accumulated near a channel, which is generated in the ON mode of the transfer transistor, resulting in high-speed operation due to an increased transfer rate.

In the solid-state imaging device, the second impurity region may be formed by self-alignment using a device-isolating film by ion implantation.

In the solid-state imaging device, the second impurity region may be formed by ion implantation by resist patterning.

In the solid-state imaging device, the impurity region of a first conductivity type below the gate electrode may be formed by self-alignment using a device-isolating film by ion implantation.

In the above configurations, only the ion-implanted region of the second impurity region is ion-implanted by resist patterning. Thus, the concentration near the gate electrode is higher than that further away from the gate electrode. Thus, the potential is low near the gate electrode, so that the charges are concentrated to the channel region below the gate electrode by diffusion. This phenomenon increases the charge transfer rate, resulting in high-speed readout. Thus, this solid-state imaging device is suitable for a high-definition area sensor and can pick up moving images with high definition.

Further objects, features and advantages of the present invention will become apparent from the following description of the preferred embodiments (with reference to the attached drawings).

DESCRIPTION OF THE PREFERRED EMBODIMENTS

Figure 1:
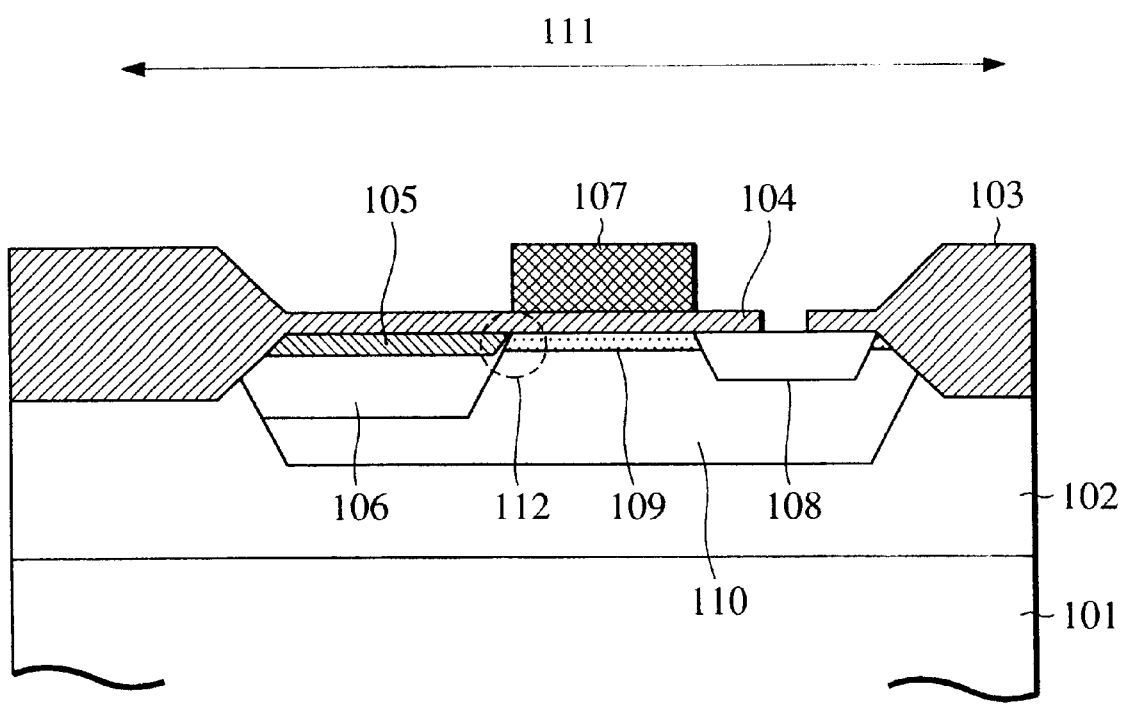
FIG. 1 is a schematic view of a solid-state imaging device according to first and second embodiments of the present invention.

With reference to FIG. 1, a solid-state imaging device according to the present invention includes a photodiode including a well region (PWL) 102 of a first conductivity type, a first impurity region (n region) 106 of a second conductivity type, and a heavily doped impurity region (p+ region) 105 of a first conductivity type formed on the first impurity region 106. The solid-state imaging device further includes a gate electrode 107 that transfers charges accumulated in the photodiode and a readout region 108 composed of an impurity region of a second conductivity type. A second impurity region 110 of a second conductivity type extends from the first impurity region 106 of a second conductivity type to the readout region 108. Furthermore, an impurity region 109 of a first conductivity type is formed below the gate electrode 107.

First Embodiment

A first embodiment of the present invention will now be described with reference to FIG. 1.
(1) Configuration FIG. 1 is a schematic view of a solid-state imaging device according to a first embodiment. A well region 102 of a first conductivity type (hereinafter referred to as "PWL region" or "p region") is formed on an n-type semiconductor substrate 101. The solid-state imaging device includes a LOCOS oxide film 103, a gate oxide film 104, a heavily doped impurity region 105 of a first conductivity type (hereinafter referred to as "p+ region"), and a first impurity region 106 of a second conductivity type (hereinafter referred to as "n region"). The p+ region 105, the n region 106, and the p region 102 constitute a photodiode. The n region 106 is preliminarily depleted. Light incident on the n region 106 generates charges, which are accumulated in the n region 106. For readout of the accumulated charges, a positive potential is applied to the gate electrode 107 to switch on a transfer transistor so that the charges are transferred to a readout region 108 formed of a heavily doped n region.

In the first embodiment, an impurity region 109 of a first conductivity type (hereinafter referred to as "p region") extends below the transfer transistor. A second impurity region 110 of a second conductivity type (hereinafter referred to as "n− region") extends from the n region 106 to the readout region 108. The p region 109 and the n− region 110 may be formed by self-alignment using the LOCOS oxide film 103 (device-isolating film) by ion implantation over an ion-implanted region shown by a double-headed arrow 111 or over the entire wafer surface. In addition to the LOCOS oxide film, other isolation layers such as a CVD oxide film may also be used for self-alignment. The dose of the ion implantation over the p region 109 must be significantly lower than that over the readout region 108. Such low dose implantation creates a characteristic effect of the solid-state imaging device of the present invention.

(2) Operation

The operation of the solid-state imaging device according to the first embodiment will now be described with reference to FIG. 1.

When the transfer transistor is switched on, the charges flow in a region below the p region 109. Thus, no potential barrier is generated at a connection 112 to the p region 109, resulting in complete transfer of the charges. Typical MOS transistors are formed of N-P-N type semiconductor regions. In contrast, in the photo detector formed according to this embodiment, the region between the n region 106 and the readout region 108 is the n− region 110. That is, these n-type regions are continuous.

In such a configuration, charges can be accumulated in the photodiode during the charge accumulation mode. The reason that this can occur is as follows. The n− region 110 has a significantly low impurity concentration and is completely depleted during the charge accumulation mode. For example, in the charge accumulation mode, the potential is 0 volts at the gate electrode 107, 0 volts at the PWL 102, 4 volts for the readout region 108, and 2 to 4 volts (varying depending on the intensity of the incident light) for the n region 106. Since a reverse bias voltage of 2 to 4 volts, which expands the depletion layer, is generated relative to the PWL 102, the n− region 110 below the gate electrode 107 is completely depleted. Since no carrier is present in the completely depleted n− region 110, a current inhibiting charge accumulation flows through the n region 106 and the readout region 108.

In the solid-state imaging device according to the first embodiment, as described above, when the transfer transistor is switched on, the charges flow in the region below the p region 109; hence, no potential barrier is generated at the connection 112 to the n region 106. Since the charges accumulated in the n region 106 can be completely transferred, the number n of the charges that remain in the photodiode formed of the p+ region 105, the n region 106, and the p region 102 will become substantially zero. As a result, the random noise in proportion to can be significantly reduced.

Second Embodiment

A second embodiment of the present invention will now be described with reference to FIG. 1.

(1) Configuration

Referring to FIG. 1, the solid-state imaging device according to the second embodiment also includes the n-type semiconductor substrate 101, the PWL 102, the LOCOS oxide film 103, the gate oxide film 104, the p+ region 105, the n region 106, the gate electrode 107, the readout region 108, the p region 109, the n− region 110, the ion-implanted region 111, and the connection 112, as in the first embodiment. The components have the same functions as those in the first embodiment.

(2) Operation

The operation of the solid-state imaging device according to the second embodiment will now be described with reference to FIG. 1.

In the first embodiment, the impurity concentration in the n− region 110 must be decreased to a significantly low level. However, it is preferable that the impurity concentration in the n− region 110 be high as much as possible, in consideration of controllability in production processes.

The second embodiment provides a solution for such an offset requirement. In the first embodiment, the potential of the gate electrode 107 at the OFF mode of the transistor is zero volts, which is the same as that of the PWL 102. In this embodiment, however, the gate electrode 107 during the charge accumulation is set to a negative potential, for example −2V, which is lower than that of the PWL 102. This electric field effect of the gate electrode 107 facilitates the expansion of the depletion layer and increases the potential of the n− region 110 below the gate electrode 107, resulting in accumulation of larger amounts of charges in the photodiode.

Third Embodiment

A third embodiment of the present invention will now be described with reference to FIG. 2.

(1) Configuration

Figure 2:
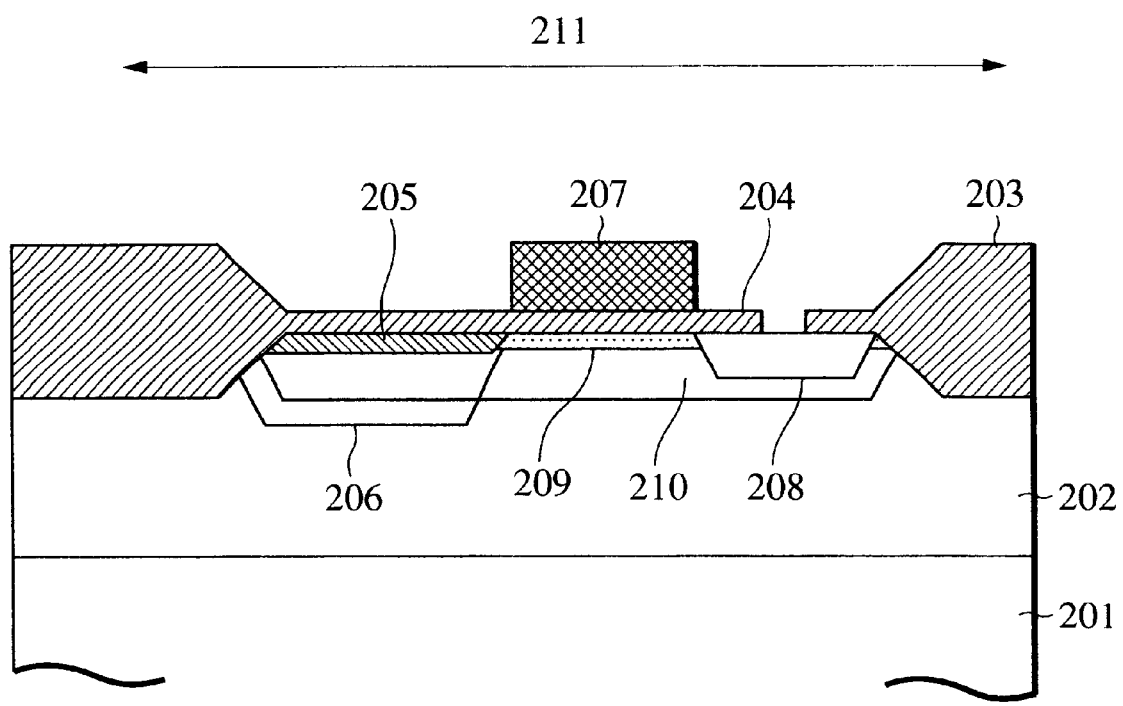
FIG. 2 is a schematic view of a solid-state imaging device according to a third embodiment of the present invention.

FIG. 2 is a schematic view of a solid-state imaging device according to the third embodiment. The solid-state imaging device includes an n-type semiconductor substrate 201, a PWL 202, a LOCOS oxide film 203, a gate oxide film 204, a p+ region 205, an n region 206, a gate electrode 207, a readout region 208, a p region 209, an n− region 210, and an ion-implanted region 211.

The third embodiment differs from the first embodiment in that the depth of the n− region 210 is less than the depth of the n region 206 of the photodiode formed of the p+ region 205 and the n region 206. Other configurations are the same as those in the first embodiment, and the description thereof is omitted.

(2) Operation

The operation of the solid-state imaging device according to the third embodiment will now be described with reference to FIG. 2.

In the third embodiment, the depth of the n− region 210 is less than that of then region 206 of the photodiode. This structure can be formed by decreasing the accelerated voltage or moderating the thermal hysteresis in the step of forming the n− region 210.

Since the width of the n− region 210 is less than that the n− region 110 in the first embodiment, the n− region 210 can be depleted with a smaller reverse bias potential even if the impurity concentration is the same, enhancing production versatility. Furthermore, larger amounts of charges can be accumulated in the photodiode.

Regarding the depth profile of the impurity concentration in the photodiode, the n region 206 overlaps with the n− region 210 at the low depth side. Thus, the n region 206 has a higher impurity concentration. Charges generated in a high depth position in the photodiode are accumulated in a lower-potential position near the surface. This effect enhances the possibility of capturing the charges generated in a large depth side in the photodiode, enhancing the sensor sensitivity. Furthermore, the charges are accumulated near the channel, which is generated in the ON mode of the transfer transistor, resulting in high-speed operation due to an increased transfer rate.

In the third embodiment, as described above, the solid-state imaging device has the same advantages as those in the first embodiment. In addition, a lower potential is applied to the gate electrode 207 relative to the PWL 202 during the charge accumulation; hence, the solid-state imaging device has the same advantages as those in the second embodiment.

Fourth Embodiment

A fourth embodiment of the present invention will now be described with reference to FIG. 3.

(1) Configuration

Figure 3:
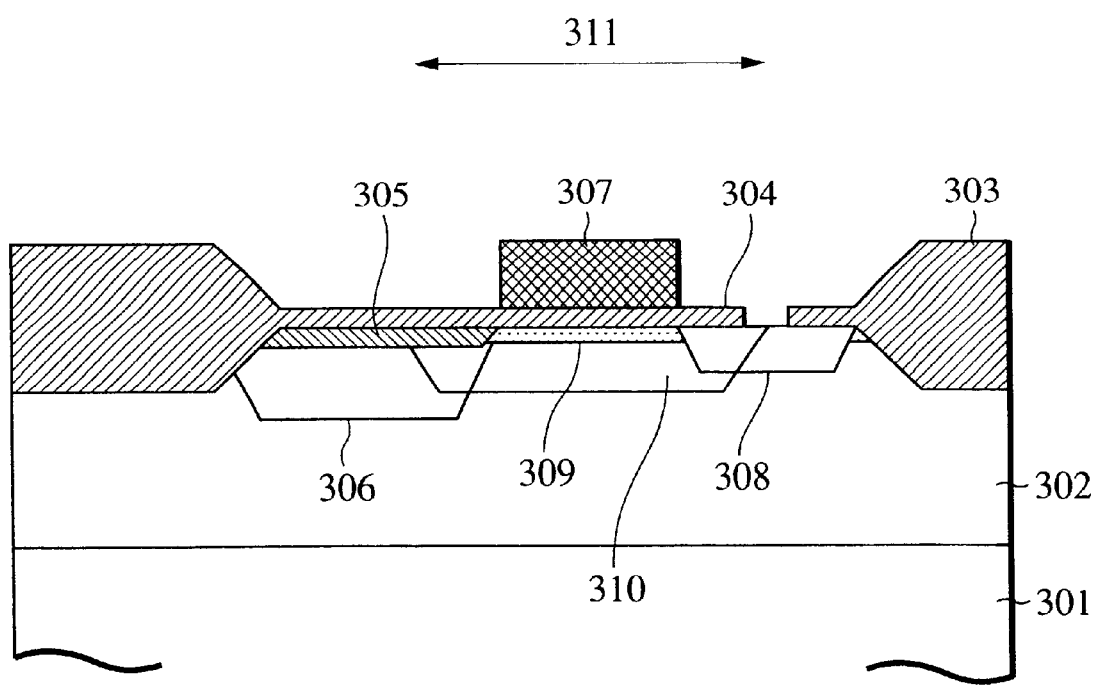
FIG. 3 is a schematic view of a solid-state imaging device according to a fourth embodiment of the present invention.

FIG. 3 is a schematic view of a solid-state imaging device according to the fourth embodiment. The solid-state imaging device includes an n-type semiconductor substrate 301, a PWL 302, a LOCOS oxide film 303, a gate oxide film 304, a p+ region 305, an n region 306, a gate electrode 307, a readout region 308, a p region 309, an n− region 310, and an ion-implanted region 311.

The fourth embodiment differs from the first embodiment in that only an ion-implanted region 311 indicated by a double headed arrow of the n− region 310 is ion-implanted by resist patterning. Other configurations are the same as those in the first embodiment, and the description thereof is omitted.

(2) Operation

The operation of the solid-state imaging device according to the fourth embodiment will now be described with reference to FIG. 3. In the fourth embodiment, only the ion-implanted region 311 of the n− region 310 is ion-implanted by resist patterning.

Regarding the concentration profile in the transverse direction of the photodiode section, the concentration near the gate electrode 307 is higher than that at a greater distance away from the gate electrode 307. Thus, the potential is low near the gate electrode 307, so that the charges are concentrated to the channel region below the gate electrode 307 by diffusion. This phenomenon increases the charge transfer rate, resulting in high-speed readout. Thus, this solid-state imaging device is suitable for a high-definition area sensor and can pick up moving images with high definition.

In the fourth embodiment, as described above, the solid-state imaging device has the same advantages as those in the first embodiment. In addition, a lower potential is applied to the gate electrode 307 relative to the PWL 302 during the charge accumulation; hence, the solid-state imaging device has the same advantages as those in the second embodiment.

Fifth Embodiment

In the first to fourth embodiments, the solid-state imaging devices are of a type that accumulates electrons. A solid-state imaging device of a hole accumulating type having a reverse polarity and reverse bias relationship in the semiconductor also has the same advantages shown in the first to fourth embodiments.

Sixth Embodiment

Figure 4:
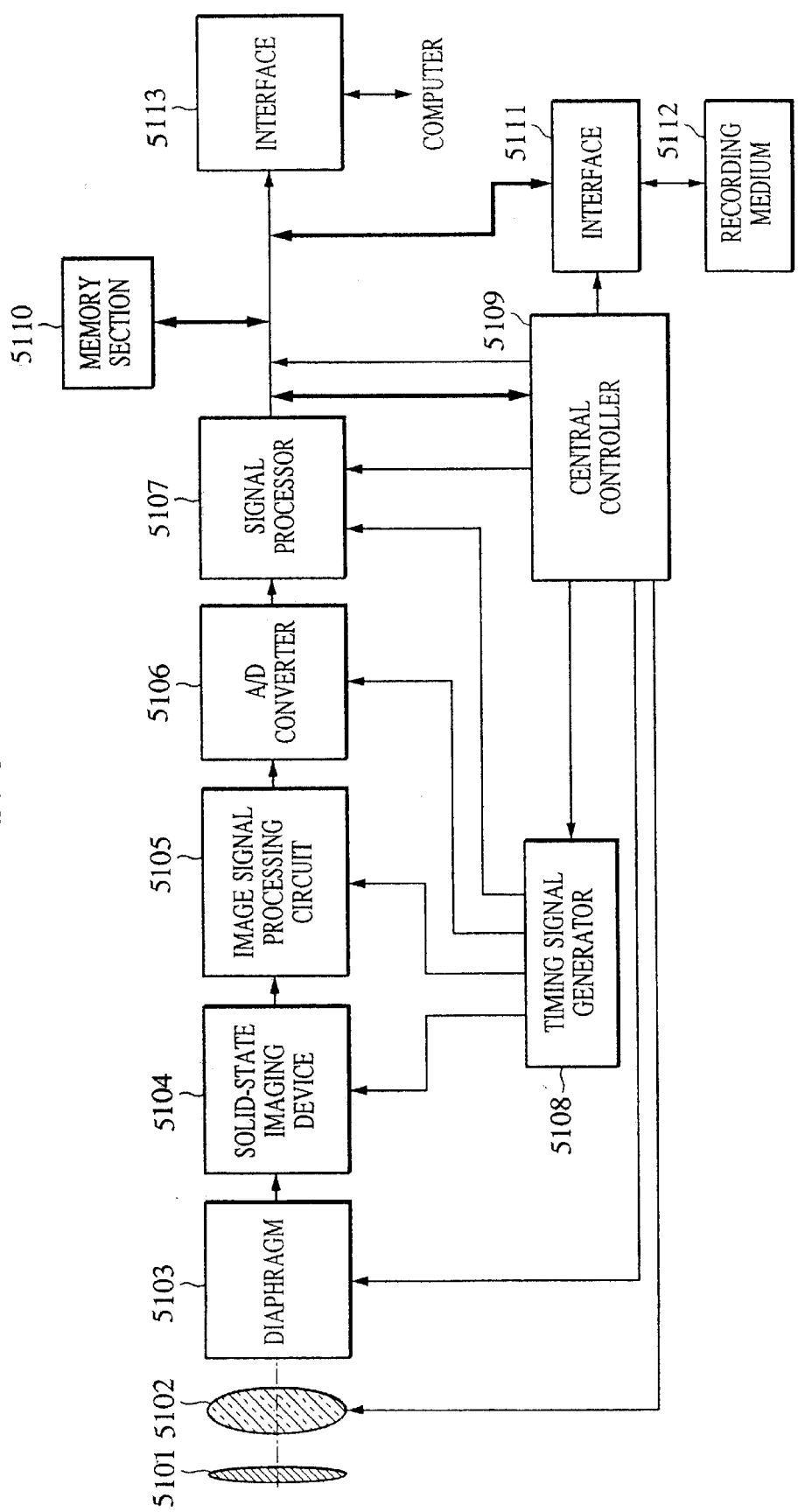
FIG. 4 is a block diagram of a still video camera including the solid-state imaging device of the present invention.
Figure 5:
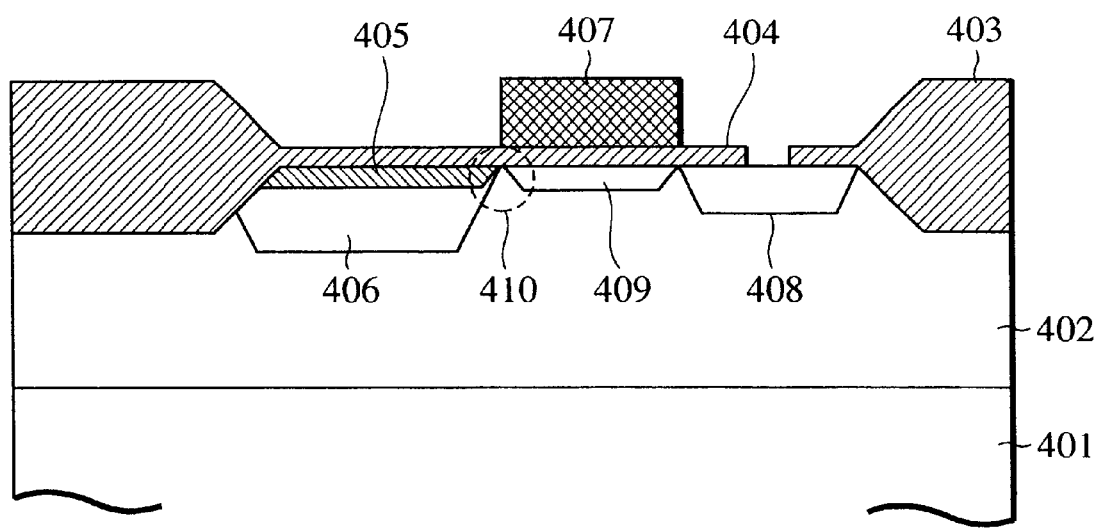
FIG. 5 is a schematic view of a known solid-state imaging device.

FIG. 4 is a block diagram of a still video camera including the solid-state imaging device according to the present invention.

The still video camera includes a barrier 5101 that protects a lens 5102 and functions as a main switch, the lens 5102 focusing an optical image of an object to a solid-state imaging device 5104 that converts the focused image into image signals; a diaphragm 5103 that changes the quantity of light from the lens 5102; an image signal processing circuit 5105 that processes the image signals from the solid-state imaging device 5104; an A/D converter 5106 that converts the image signals from the solid-state imaging device 5104 into digital signals; a signal processor 5107 that corrects and compresses the image data from the AID converter 5106; a timing signal generator 5108 that outputs timing signals to the solid-state imaging device 5104, the image signal processing circuit 5106, the A/D converter 5106, and the signal processor 5107; a central controller 5109 that performs various calculations and comprehensively controls the still video camera; a memory section 5110 that temporarily stores the image data; an interface 5111 that records/reads out the image data onto/from a detachable recording medium 5112, such as a semiconductor memory; and an interface 5113 for communicating with an external device, such as a computer.

The operation of this still video camera during the on-camera mode will now be described.

When the barrier 5101 is opened, the primary cable is switched on, followed by switching on the control system and the imaging circuits such as the A/D converter 5106.

In order to control the light exposure, the central controller 5109 opens the diaphragm 5103. The light output from the solid-state imaging device 5104 is converted into digital data in the A/D converter 5106 and is input into the signal processor 5107. The central controller 5109 calculates the exposure based on the input data.

The central controller 5109 determines the brightness based on the photometry and controls the diaphragms based on the brightness.

The central controller 5109 then calculates the distance from the object using high-frequency components extracted from the signals output from the solid-state imaging device 5104, and drives the lens 5102 to determine whether or not the camera is focused.

If the camera is not focused, the central controller 5109 redrives the lens 5102 to determine the distance.

After the camera is focused, real exposure starts. After the real exposure, the image signals output from the solid-state imaging device 5104 are converted into digital data in the A/D converter 5106 and are stored in the memory section 5110 through the signal processor 5107 under the control of the central controller 5109. The image data stored in the memory section 5110 is recorded on the detachable recording medium 5112 such as a semiconductor memory through the interface 5111 under the control of the central controller 5109. The image data may be directly input into a computer through the interface 5113 to process the image data.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid-state imaging device comprising:

a photodiode comprising a well region of a first conductivity type, a first impurity region of a second conductivity type, and a heavily doped impurity region of the first conductivity type formed on the first impurity region;

a gate electrode that transfers charges accumulated in the photodiode;

a readout region comprising an impurity region of the second conductivity type;

a second impurity region of the second conductivity type extending from the first impurity region to the readout region; and a third impurity region of the first conductivity type formed below the gate electrode.

2. A solid-state imaging device according to claim 1, wherein the second impurity region has an impurity concentration such that the second impurity region is depleted when charges are accumulated in the photodiode.

3. A solid-state imaging device according to claim 2, wherein the second impurity region is depleted below the gate electrode when charges are accumulated in the photodiode.

4. A solid-state imaging device according to any one of claims 1 to 3, wherein the depth of the second impurity region is smaller than the depth of the first impurity region.

5. A solid-state imaging device according to claim 1, wherein a potential lower than that applied to the well region is applied to the gate electrode when charges are accumulated in the photodiode.

6. A solid-state imaging device according to claim 1, wherein a part of the first impurity region overlaps with the second impurity region at a position at which the first impurity region is in contact with the gate electrode, and another part of the first impurity region does not overlap with the second impurity region.

7. A solid-state imaging device according to claim 1, wherein the second impurity region is formed by self-alignment using a device-isolating film by ion implantation.

8. A solid-state imaging device according to claim 1, wherein the second impurity region is formed by ion implantation by resist patterning.

9. A solid-state imaging device according to claim 1, wherein the third impurity region of a first conductivity type below the gate electrode is formed by self-alignment using a device-isolating film by ion implantation.

10. A camera comprising a solid-state imaging device according to any one of claims 1 to 4 and 6 to 9.

* * * * *